United States Patent [19]

Khan et al.

[11] Patent Number: 4,517,731

[45] Date of Patent: May 21, 1985

[54] DOUBLE POLYSILICON PROCESS FOR FABRICATING CMOS INTEGRATED CIRCUITS

[75] Inventors: Mahboob Khan, Milpitas; Tom Trieu, San Jose, both of Calif.

[73] Assignee: Fairchild Camera & Instrument Corporation, Mountain View, Calif.

[21] Appl. No.: 537,188

[22] Filed: Sep. 29, 1983
(Under 37 CFR 1.47)

[51] Int. Cl.³ .................... H01L 21/265; H01L 21/31
[52] U.S. Cl. ................................ 29/571; 29/577 C; 29/578
[58] Field of Search ............... 29/571, 577 C, 578; 148/1.5; 357/23 CS, 44, 59

[56] References Cited

U.S. PATENT DOCUMENTS

| 4,135,955 | 1/1979 | Gasner et al. | 29/571 |
| 4,192,059 | 3/1980 | Khan et al. | 29/578 |
| 4,391,650 | 7/1983 | Pfeifer et al. | 29/576 B |
| 4,397,077 | 8/1983 | Derbenwick et al. | 29/571 |
| 4,409,723 | 10/1983 | Harari | 29/577 C |
| 4,420,871 | 12/1983 | Scheibe | 29/571 |
| 4,451,841 | 5/1984 | Hori et al. | 357/59 |

Primary Examiner—Brian E. Hearn
Assistant Examiner—Hunter L. Auyang
Attorney, Agent, or Firm—Carl L. Silverman; Robert C. Colwell; Michael Pollock

[57] ABSTRACT

A process is disclosed for fabricating complementary n and p channel insulated gate field effect transistors. The process uses two layers of polycrystalline silicon 32 and 44 to provide electrical interconnections, and allows the formation of microcapacitors between the two layers of polycrystalline silicon. In addition silicon dioxide and silicon nitride, and two layers of photoresist, are used as masks against heavy boron implantations. The reliability of ohmic connections between aluminum 50 and contact regions in the substrate is enhanced by providing additional dopant to the contact regions. In this way, the junction depth is increased and electrical defects caused by metal spiking are minimized.

10 Claims, 14 Drawing Figures

DOUBLE POLYSILICON PROCESS FOR FABRICATING CMOS INTEGRATED CIRCUITS

BACKGROUND OF THE INVENTION

1. Field of the Invention

The present invention relates generally to complementary insulated gate field effect transistor structures and processes for fabricating them. More particularly, this invention relates to an improved method for fabricating CMOS devices which results in higher density integrated circuits having greater reliability.

2. Description of the Prior Art

Complementary insulated gate field effect transistor (FET) circuit arrangements employ an n-channel FET and a p-channel FET which usually have commonly connected gates, and the source or drain of one transistor connected to the source or drain of the other transistor. Connected as such, the two transistors require signals of opposite polarity for conduction, and in any mode of circuit operation, one of the transistors will be on while the other will be off. Therefore little current will flow from the power supply to ground. When operating conditions within the overall circuit containing the CMOS device require that the "on" transistor be switched off, the transistor which was previously off will be switched on due to interconnection of the gates and either the sources or the drains of the two complementary transistors. This concept was first disclosed by Wanlass in U.S. Pat. No. 3,356,858, assigned to the assignee of the present invention. CMOS devices are particularly useful because no additional power is required to switch the transistors of the complementary pair. Switching is an inherent attribute of CMOS device operation.

Conventional CMOS structures have been fabricated with conducting interconnections between particular sources and drains of the n-channel and p-channel transistors. The conductors may be metal, but more recently have been conductive polycrystalline silicon. Silicon dioxide is the most widely used insulator in CMOS devices and single crystal silicon is the most widely used semiconductor substrate.

CMOS structures are usually fabricated in an N conductivity type silicon substrate rather than in a P-type substrate because it is easier to obtain desirable threshold voltages for both the n-channel and the p-channel complementary devices in an n-type substrate. A region or well of p-type conductivity is formed in the n-type substrate to accommodate the n-channel transistor.

CMOS structures typically utilize a single layer of polycrystalline silicon and a single layer of aluminum as interconnections. Certain other integrated circuit technologies utilize a first polycrystalline silicon layer as gate electrodes and electrical interconnections, a second polycrystalline silicon layer as high resistivity resistors, and a layer of aluminum as interconnections. Prior art CMOS fabrication techniques typically utilize photoresist for masking heavy ion implantations.

SUMMARY OF THE INVENTION

In contrast with prior art CMOS processes, the process of the present invention utilizes two layers of polycrystalline silicon as electrical interconnections. This structure allows capacitors to be formed between the two layers of polysilicon.

Silicon dioxide and silicon nitride, rather than photoresist, are used as masks against heavy boron implantations. The use of silicon dioxide and silicon nitride as a mask for such implantations is less expensive, more reliable and much easier to work with as compared with the use of photoresist.

The process of the present invention also employs a unique contact scheme which enhances the reliability of the electrical contacts between metal and shallow n-type contact regions by providing additional dopant to the n-type contact regions which are to be contacted by metal. In this way, the junction depth of the n-type contacts is increased and electrical defects caused by metal spiking down through the contact region to the substrate are minimized.

Other unique features of the process of the present invention are the use of a two-layer resist as a blocking mask to form self-aligned p-channel field regions to independently enhance p-channel field thresholds, a nonselective maskless n-channel field implant to enhance n-channel thresholds, and a maskless boron implant to simultaneously adjust both p-channel and n-channel thresholds.

According to the process of the present invention, p-type impurity is implanted into a preselected portion of an n-type semiconductor substrate to form a lightly-doped p-well region which is contiguous with a major surface of the substrate. The p-well will serve as the active area for the n-channel transistor of the CMOS device. A first layer of thin oxide is then formed on the surface of the substrate, and a layer of silicon nitride is formed over the thin oxide layer. A first layer of photoresist is applied and the nitride layer is patterned and etched to form a first nitride region on the oxide overlying the p-well such that portions of the oxide adjacent the first nitride region and overlying the p-well remain exposed and a second nitride region on the oxide overlying a preselected second portion of the n-type substrate. The portion of the substrate underlying the second nitride region will become the active area for the p-channel transistor of the CMOS device.

While the first layer of photoresist is retained on the two nitride regions over the thin oxide, a second layer of photoresist is formed over the exposed thin oxide and the two regions of first photoresist. The photoresist is patterned to again expose the portions of the thin oxide layer overlying the p-well and adjacent to the first nitride region. Using the two layers of photoresist as a mask, additional p-type impurities are then implanted through the exposed portions of the thin oxide layer and into the underlying p-well as an n-channel field implant.

All of the remaining photoresist is stripped to expose the two nitride regions and the adjacent thin oxide and n-type impurities are non-selectively implanted into the substrate as a maskless p-channel field implant to enhance p-channel thresholds. The first and second nitride regions prevent the n-type impurities from penetrating the substrate beneath these two regions. A thick layer of silicon dioxide is then selectively grown around both n-channel and p-channel active regions using the silicon nitride as a mask.

Both the nitride regions and the underlying thin oxide formed over the active regions are then stripped and gate oxide is formed over the active regions. (At this stage of the process, as an optional step, a layer of photoresist may be formed and patterned to expose selected p-channel regions and n-type impurity introduced to the selected p-well regions to form depletion mode p-channel devices. The photoresist is then stripped). P-type impurity is then non-selectively implanted into the active regions to adjust both p-channel and n-channel thresholds.

Next, a first layer of doped polysilicon is formed over the entire structure and etched to form a first region of first polysilicon on the gate oxide overlying the p-well, a second region of first polysilicon on the gate oxide overlying the second portion of the substrate and third regions of first polysilicon on selected field oxide regions. The first and second regions of first polysilicon will serve as the gates for the n-channel and p-channel devices, respectively, while the third regions of first polysilicon will serve as conductive interconnections.

N-type impurity is selectively implanted into the p-well adjacent the first region of the first polysilicon gates to form n-type source and drain regions of the n-channel transistor. P-type impurity is then selectively implanted adjacent the second region of first polysilicon gates to form p-type source and drain regions of the p-channel transistor. A layer of oxide is then thermally grown over the first polysilicon regions and a first set of contact openings is selectively etched through the oxide.

The first set of contact holes allows electrical contact to selected n-type regions in the substrate and to selected first polysilicon interconnects. A second layer of doped polysilicon is then formed over the entire structure and selectively patterned to provide contacts to selected n-type implanted regions and to selected first polysilicon interconnects.

A layer of oxide is then thermally grown over the second polysilicon regions and a second set of contact holes is selectively etched through the oxide. This second set of contact holes allows ohmic contacts to selected n-type implanted regions, selected first polysilicon regions and selected regions of second polysilicon or any combination thereof. A layer of phosphosilicate glass is then formed over the entire structure and a third set of contact openings is selectively etched in the glass to allow ohmic contacts to selected p-type conductors. A layer of metal is then deposited on the glass and patterned to interconnect different devices through the third set of contact holes. Finally, a protective layer is formed over the entire wafer.

BRIEF DESCRIPTION OF THE DRAWINGS

FIG. 1 is a cross-section of a small portion of a semiconductor wafer which has been oxidized.

FIG. 2 is a subsequent cross-section after implantation of suitable impurities to form a p-well.

FIG. 3 is a subsequent cross-section after definition of regions in which MOS devices will be formed.

FIG. 4 is a subsequent cross-section after masking and implanting boron to increase the field threshold of the n-channel transistor.

FIG. 5 is a subsequent cross-section after implantation of phosphorous.

FIG. 6 is a subsequent cross-section after formation of the field oxide and gate oxide regions.

FIG. 7 is a subsequent cross-section after a boron implantation to tailor the threshold of the MOS devices.

FIG. 8 is a subsequent cross-section after definition of first layer of polycrystalline silicon into gates of the MOS devices and conducting lines.

FIG. 9 is a subsequent cross-section after implantation of arsenic to form n-channel source and drain regions.

FIG. 10 is a subsequent cross-sectional view after a further boron implantation to define the source and drain regions of the p-channel transistor.

FIG. 11 is a subsequent cross-sectional view after formation of contact openings to desired underlying regions.

FIG. 12 is a subsequent cross-sectional view after formation of a second layer of polycrystalline silicon to provide additional electrical connections.

FIG. 13 is a subsequent cross-sectional view after formation of a layer of phosphosilicate glass and formation of further contact openings therein.

FIG. 14 is a subsequent cross-sectional view after deposition of a layer of metal to provide additional electrical connections.

DETAILED DESCRIPTION OF THE PREFERRED EMBODIMENTS

FIGS. 1–16, in conjunction with the following description, illustrate the fabrication of a CMOS structure according to the process of the present invention. Numerous details of the preferred process, such as conductivity types, impurities, impurity concentrations, processing times and temperatures have been included in the description to provide a complete understanding of the invented process. As will be appreciated, however, numerous well-known variations of the described process may be employed without departing from the scope of the invention. Furthermore, in some instances, well-known photolithographic steps are not shown to avoid obscuring the invented process with excessive conventional detail.

Figure 1:
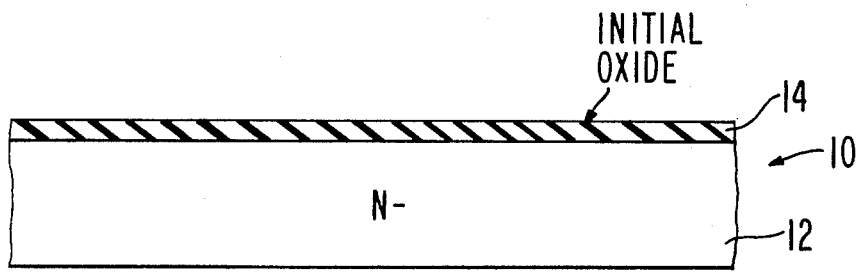
FIGS. 1 through 14 illustrate a preferred embodiment of the process of this invention. In particular.

FIG. 1 shows a small section of a semiconductor wafer 10 which section is sufficient in size for the formation of a pair of complementary metal oxide semiconductor (CMOS) devices according to the process of the present invention. It will be understood by those familiar with integrated circuit fabrication techniques that simultaneously with the formation of the illustrated CMOS structure, a plurality of similar CMOS devices and electrical interconnections will be fabricated in and on the wafer 10 according to techniques well-known in the semiconductor industry.

In the preferred embodiment wafer 10 comprises an n-type semiconductor substrate 12, preferably silicon having a (100) crystal orientation and a resistivity of approximately 2–4 ohm centimeters. Of course, other, typically higher, resistivity substrates may be employed to minimize junction capacitance and enhance the performance of the circuits fabricated therein. An initial layer 14 of insulating material, preferably silicon dioxide, is formed on a major surface of the substrate 12. In the preferred embodiment, the initial oxide layer 14 is formed to a thickness of about 6500 Angstroms by the thermal oxidation of the underlying silicon substrate 12 in stream. Other well-known techniques such as chemical vapor deposition (CVD) may also be employed to form layer 14.

Figure 2:
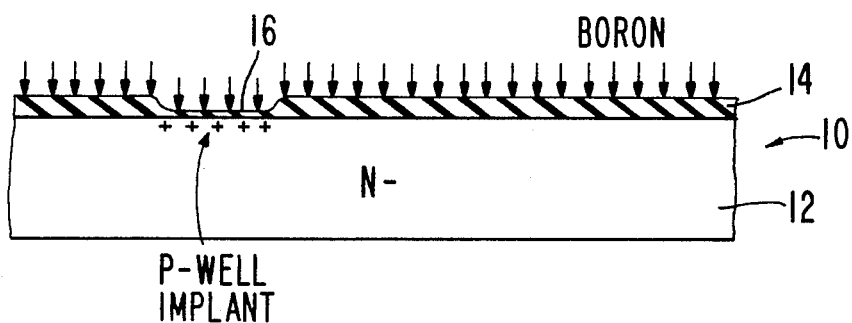

Following formation of oxide layer 14, a region or well of p conductivity type is formed in the substrate 12 to accommodate the n-channel transistor of the CMOS structure. To form the p-type region, a layer of photoresist (not shown) is formed over the oxide layer 14 and patterned by conventional techniques to expose the portion of layer 14 beneath which a p-type well is desired. The exposed portion of the oxide layer 14 is then removed by well-known etching techniques. As shown in FIG. 2, a thin layer 16 of silicon dioxide, approximately 600 Angstroms thick, is then thermally regrown over the exposed portion of the substrate 12. Boron ions are then implanted through the thin oxide layer 16 into the substrate 12 at an energy level of approximately 100 KEV to a dose of about $8 \times 10^{12}$ atoms/cm$^2$. The thicker initial oxide layer 14 surrounding thin oxide 16 serves as a mask to prevent implantation of boron into undesired regions of the substrate 12, while the thinner oxide 16 allows the boron ions to reach the substrate 12 in the selected region. While regrowth of the thin oxide layer 16 prior to the boron implant is not essential, it is preferred because it prevents contamination of the p-well during a subsequent high temperature drive-in step.

After implantation of the boron, the wafer 10 is heated to a temperature of approximately 1150° C. in dry oxygen for approximately 500 minutes to cause the boron to diffuse to a depth of approximately 4 microns, thereby forming p-well region 18. During this process the silicon dioxide will thicken slightly more over the p-well than elsewhere, creating the indentation of well 18 below the major surface of substrate 12 (See FIG. 3).

Figure 3:
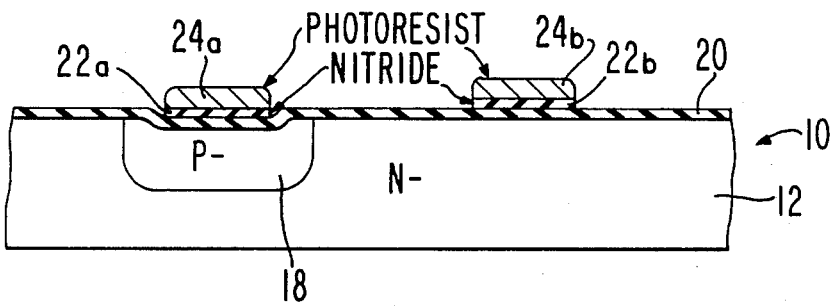
Figure 4:
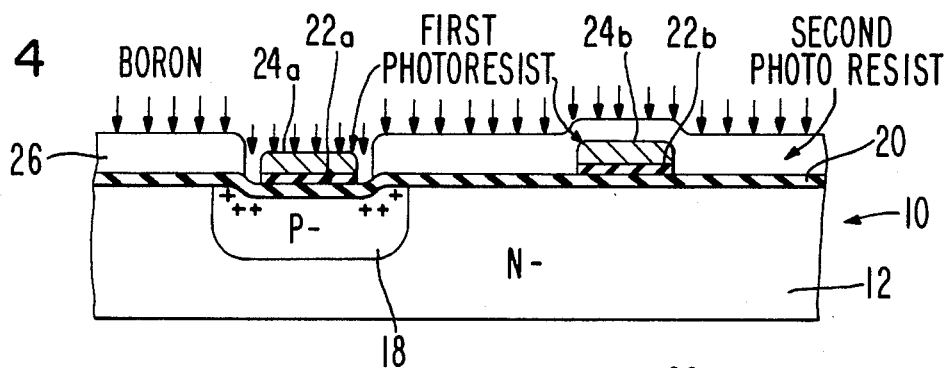

Next the initial oxide layer 14 as well as the thin oxide layer 16 are completely removed by conventional techniques. Then, as shown in FIG. 3, a new layer of thin oxide 20, approximately 600 Angstroms thick, is formed over the substrate 12 by dry thermal oxidation. A layer of silicon nitride 22, approximately 1200 Angstroms thick, is then formed on the thin oxide layer 20 by low pressure chemical vapor deposition. A first photoresist layer 24 is spun on the wafer 10, and both this first photoresist layer and the underlying silicon nitride layer are patterned and etched to define first and second silicon nitride regions 22a, 22b and corresponding overlying first and second regions 24a, 24b of first photoresist. The first nitride region 22a and the first region 24a of first photoresist are formed on the thin oxide 20 overlying the p-well 18 such that portions of the oxide 20 adjacent the nitride 22a and overlying the p-well 18 are exposed. The second nitride region 22b and second region 24b of first photoresist are formed on thin oxide 20 overlying a second preselected portion of the substrate 12. One MOS device will be formed in well 18, while another MOS device will be formed at the location defined by the second preselected portion of nitride 22b.

Next, while retaining the first photoresist regions 24a and 24b, a second layer of photoresist 26 is formed over the major surface of the wafer 10 and patterned to again expose the portions of the thin oxide layer 20 overlying the p-well 18 and adjacent the first nitride region 22a. The regions of the p-well 18 underlying the exposed oxide portions are then further implanted with boron at about 25–60 KEV to a dose of about $1.5 \times 10^3$ atoms/cm$^2$ to increase the field threshold of the n-channel transistor. The second layer of photoresist 26 prevents the implant from reaching the substrate 12 elsewhere.

Figure 5:
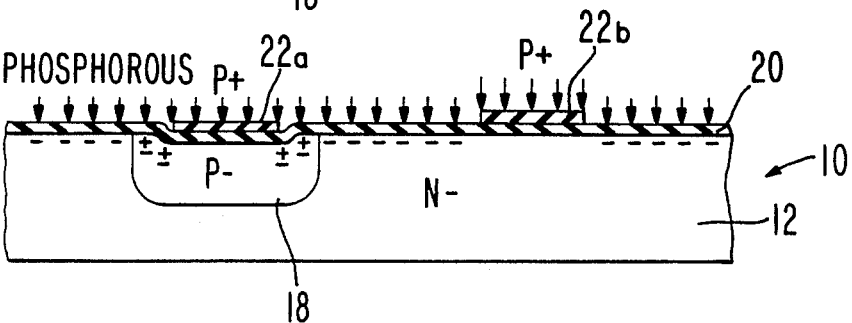
Figure 6:
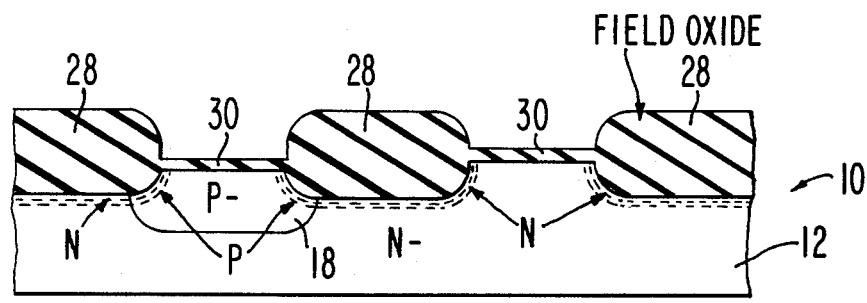

Following the n-channel field threshold implant, all remaining photoresist, including regions 24a and 24b is removed from the surface of the wafer 10, and, as shown in FIG. 5, the wafer 10 is exposed to a non-selective implant using phosphorus at about 60 KEV to a dose of about $7 \times 10$ atoms/cm$^2$ to increase the n-channel field threshold to prevent channel inversion. The wafer 10 is then annealed at about 1100° C. for about 30 minutes.

Next, silicon dioxide 7000 to 10,000 Angstroms thick is formed at desired locations, including over the implanted field region using conventional thermal oxidation techniques to form field oxide regions 28. Field oxide regions 28 electrically isolate the active regions in which the n-channel and p-channel transistors of the CMOS device will be formed from the surrounding active and passive devices. The nitride regions 22a, 22b and the underlying thin oxide 20 are then stripped using conventional process techniques. Gate oxide 30, about 650 Angstroms thick, is then thermally formed over the above regions, resulting in the structure shown in FIG. 6.

Figure 7:
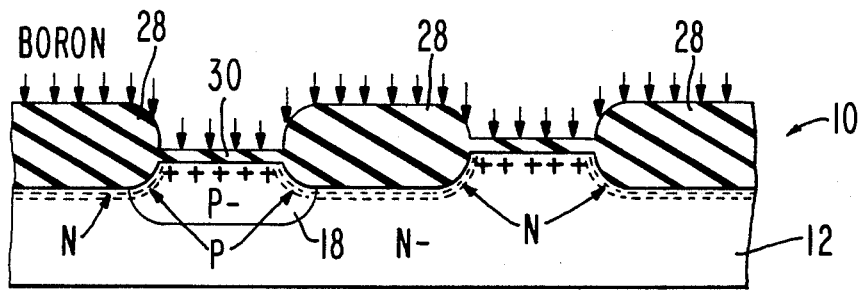
Figure 8:
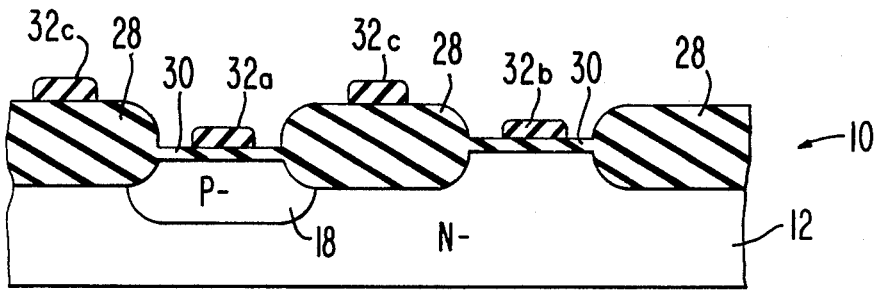

Next, a maskless boron implant is performed to tailor the threshold of both the n-channel and the p-channel transistors, as shown in FIG. 7. An optional step may be performed at this stage of the process. Using conventional photoresist masking techniques, a selective phosphorous or arsenic implant at 100 KEV to a dose of $4 \times 10^{12}$ atoms/cm$^2$ may be performed to fabricate depletion mode devices. The depletion implant photoresist mask is stripped following the arsenic implant. A first layer of polycrystalline silicon 32 about 6500 Angstroms thick is then formed on the major surface of the wafer 10 by low pressure CVD and doped with phosphorus to a sheet resistivity of approximately 20 ohms/square. This first polysilicon layer 32 is then patterned and etched using well known integrated circuit process technology to form a first region 32a of first polysilicon on the gate oxide 30 overlying the p-well 18, a second region 32b of first polysilicon on the gate oxide 30 overlying the second portion of the substrate, and third regions 32c of first polysilicon on selected of the field oxide regions 28. The resulting structure is shown in FIG. 8. As will become evident from the following description, polysilicon regions 32a and 32b will be the gates for the n-channel and p-channel transistors, respectively, and polysilicon regions 32c will be electrically conductive interconnections among various regions of the integrated circuit.

Figure 9:
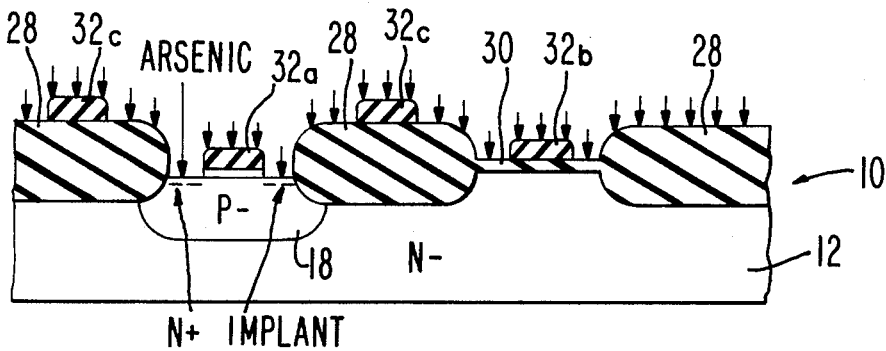

The major surface of the wafer 10 is then coated with photoresist which is patterned to expose the n-channel transistor, particularly the silicon dioxide overlying the to-be-formed source and drain regions. The thin oxide overlying the source and drain regions is then etched to expose the underlying substrate 12. The polysilicon gate 32a protects the gate oxide beneath it and prevents it from being removed. As shown in FIG. 9, the exposed substrate regions are then selectively implanted with arsenic at approximately 40 KEV to a dose of approximately $5 \times 10^{15}$ atoms/cm$^2$ to form n-channel n+ source and drain regions 34 and 36, respectively. The first polysilicon regions 32 and silicon dioxide 28 and 30 act as masks during the arsenic implant. Following the arsenic implant, the arsenic atoms are driven into the wafer at about 1000° C. to the desired junction depth, preferably about 0.6 microns.

Figure 10:
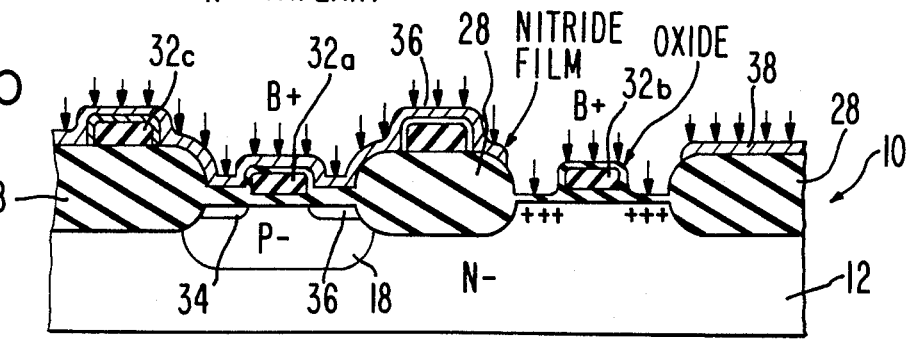

During the diffusion, a thin layer of silicon dioxide about 1000 Å will be thermally formed over the N+ implanted n-channel source and drain regions 34 and 36 and over the first polysilicon regions 32a, 32b, 32c. A layer 38 of silicon nitride about 2000 Å thick is then deposited over the entire wafer and masked and etched to expose the p-channel transistor, particularly the silicon dioxide overlying the to-be-formed source and drain regions there of. Using the silicon nitride and polysilicon gate 32b as masks, boron is implanted into the substrate 12 at 30 KEV to a dose of about $5\times10^{15}$ atoms/cm$^2$, as shown in FIG. 10.

Figure 11:
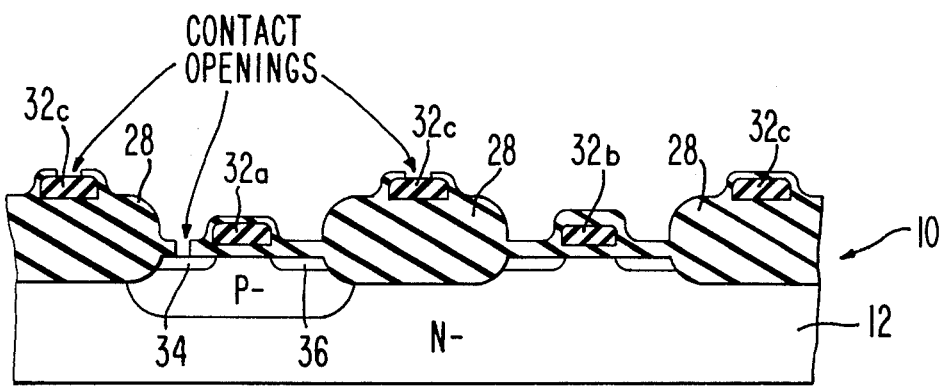

Next, the silicon nitride mask 38 is stripped and the oxide overlying the first polysilicon regions 32a, 32b, 32c is thermally grown to a desired thickness which may range from about 1000–3000 Å. During this procedure the boron will be driven into substrate 12 to a depth of about 0.8 microns forming source/drain regions 40 and 42. The wafer 10 is then coated with photoresist which is patterned to expose contact regions over desired regions. As shown in FIG. 11, a first set of contact openings are then selectively etched in the oxide to permit ohmic contact to selected N+ regions in the substrate and to selected first polysilicon interconnection regions.

Figure 12:
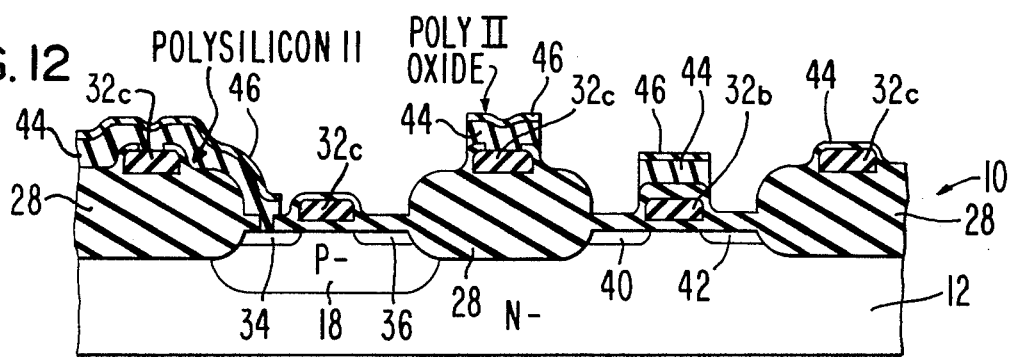
Figure 13:
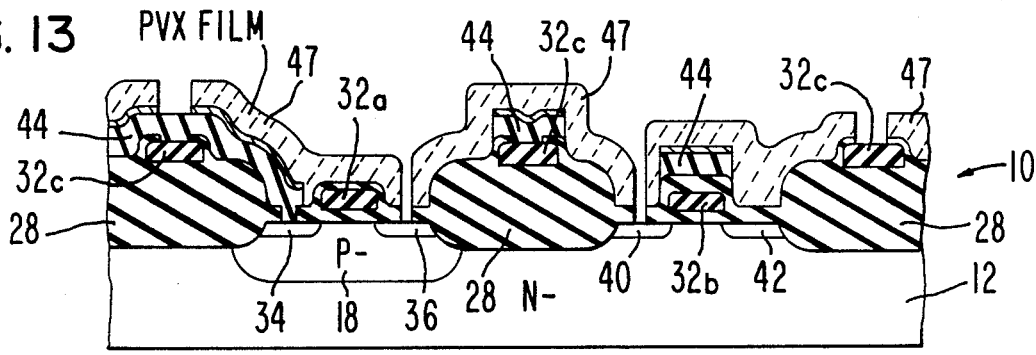

A second layer 44 of polycrystalline silicon, about 6500 Angstroms thick, is formed by low pressure CVD on wafer 10, doped with phosphorus at about 950° C. to a sheet resistivity of about 20 ohms/square. After thermal formation of a thin layer of (1000 Angstroms) of silicon dioxide 46, polysilicon layer 44 is masked and etched to define electrically conductive interconnections to the selected n-type regions in the substrate and to the selected first polysilicon interconnect regions. The layer of conductive second polysilicon can also be patterned over silicon dioxide on the first polysilicon to form high-value micro-capacitors (not shown). The capacitance per unit area of such poly-capacitors can be selected by adjusting the interpolysilicon oxide thickness. The resulting structure is shown in FIG. 12.

A phosphosilicate glass film 47 (PVX) about 10,000 Angstroms thick is then deposited over the wafer 10 and densified at a temperature of 950° C. Using conventional photomasking and etch techniques, a third set of contact openings is formed over desired regions, and the underlying silicon dioxide removed using conventional processes.

Figure 14:
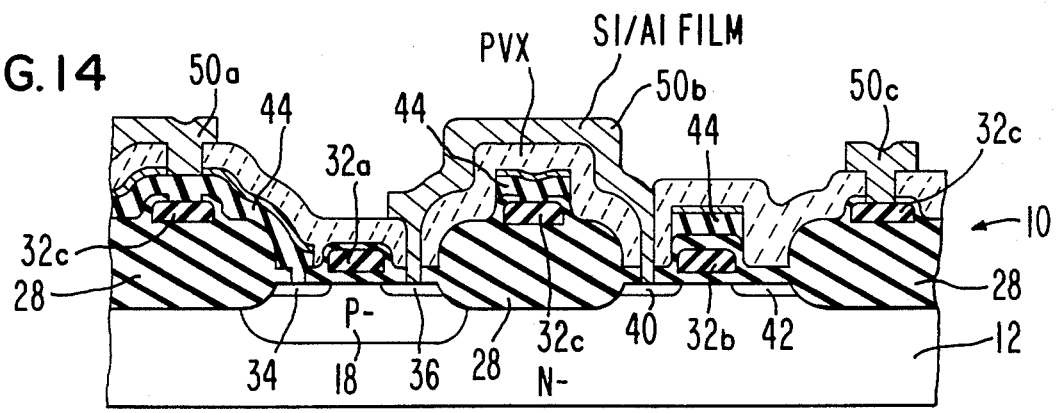

The phosphosilicate glass is then reflowed, typically by heating, to remove sharp edges at the contact holes. Next, a metal layer preferably silicon/aluminum alloy, is sputtered on the major surface of the wafer. Plasma or wet etching is then used to form the appropriate metal interconnects, as illustrated in FIG. 14.

Finally, and not shown in the Figures, after the metal interconnections have been formed, the major surface of the wafer is coated with a topside protection layer which typically is a low temperature plasma-enhanced silicon nitride formed at approximately 400°. The protective layer is then appropriately opened to expose bonding pads for testing and packaging.

We claim:

1. In a process for fabricating complementary field effect transistors (FET) wherein a first FET is formed in a well of first conductivity type in a semiconductor substrate of opposite conductivity type, a method for enhancing the field threshold of the first FET comprising:

forming a first layer of insulating material over the well;
   forming a second layer of insulating material over a selected portion of the first layer, the selected portion being disposed over the well, but spaced apart from opposing sides of the well;
   forming masking material over all of the second layer, and all of the first layer except an intervening region of the first layer between the selected portion and the opposing sides of the well; and
   introducing first conductivity type impurity into the intervening region.

2. A method as in claim 1 wherein the first layer comprises silicon dioxide.

3. A method as in claim 2 wherein the second layer comprises silicon nitride.

4. A method as in claim 3 wherein the masking material comprises photoresist.

5. A method as in claim 1 wherein the first conductivity type is p conductivity type.

6. A method as in claim 1 followed by the steps of:
   forming field oxide regions adjacent the p-type region and the portion of the substrate within which the n-channel transistor will be formed; and
   non-selectively introducing p-type dopant into the p-type region and the substrate.

7. In a process for fabricating complementary n-channel and p-channel insulated gate field effect transistors wherein said n-channel transistor is formed in a region of p-type conductivity within a substrate of n-type semiconductor material and said p-channel transistor is formed within the n-type substrate, a method for forming self-aligned n-channel field regions to independently enhance the field threshold of said n-channel transistor, comprising:

a. forming a layer of silicon oxide over the substrate;
   b. forming a region of silicon nitride on the oxide layer such that portions of the oxide layer adjacent the nitride region and overlying the p-type region remain exposed;
   c. forming a region of first photoresist overlying the nitride region;
   d. forming a layer of second photoresist over said structure formed according to steps (a) through (c) above and patterning the second photoresist layer to expose the first photoresist region and the portions of the oxide layer adjacent the nitride region and overlying the p-type region; and
   e. introducing p-type impurity into the p-well beneath the portions of the oxide layer.

8. A method as in claim 7 including the subsequent additional steps of fabricating capacitors comprising:
   a. forming regions of first conductive polycrystalline silicon over the complementary transistors;
   b. forming a layer of insulating material of desired thickness over the first polycrystalline silicon; and
   c. forming regions of second conductive polycrystalline silicon over the layer of insulating material and over the underlying regions of first polycrystalline silicon wherever capacitors are desired.

9. A method for fabricating complementary n-channel and p-channel insulated gate field effect transistors, comprising:
   a. forming a p-type well in a substrate of n-type silicon which p-well is contiguous with a major surface of the substrate;
   b. forming a layer of silicon oxide over the major surface;
   c. forming a first region of silicon nitride on the oxide overlying the p-well such that portion of the oxide adjacent the first nitride region and overlying p-well remain exposed and a second region of silicon nitride on the oxide overlying a second portion of the substrate;
   d. forming first and second regions of first masking material over the first and second regions of nitride, respectively;

e. forming a layer of second masking material over the first and second regions of first masking material and the oxide and defining the second masking material layer to re-expose portions of the oxide adjacent the first nitride region and overlying the p-well;

f. introducing p-type impurity into the p-well through the exposed oxide;

g. removing the first and second masking material and non-selectively introducing n-type impurity into the substrate;

h. forming field oxide regions adjacent the p-well and the second portion of the substrate to electrically isolate the p-well and the second portion of the substrate;

i. non-selectively introducing p-type impurity into the p-well and the second portion of the substrate;

j. forming first, second and third regions of conductive first polycrystalline silicon on the oxide overlying the p-well, on the oxide overlying the second portion of the substrate, and on selected of the field oxide regions, respectively;

k. utilizing silicon nitride as a mask, selectively introducing n-type impurities into the p-well to form source and drain regions of the n-channel transistor;

l. selectively introducing p-type impurity into the second substrate portion to form source and drain regions of the p-channel transistor;

m. forming regions of second polycrystalline silicon in contact with selected of the first polysilicon regions and n-type regions of such substrate;

n. forming regions of metal in contact with selected second polycrystalline silicon regions, first polycrystalline silicon regions, and different n-type and p-type regions of said substrate.

10. A method for fabricating a complementary insulated gate field effect transistor structure wherein n-channel and p-channel transistors are formed within the same semiconductor substrate, comprising:

a. forming an initial layer of silicon oxide on a major surface of a substrate of n-type silicon;

b. removing a portion of the initial silicon oxide layer to define a first preselected portion of the surface;

c. introducing p-type impurity into the first preselected surface portion to form a lightly-doped p-well region in the substrate, the p-well region being contiguous with the major surface of the substrate;

d. removing the remaining initial silicon oxide layer and forming a first thin oxide layer on the surface;

e. forming a first region of silicon nitride on the first thin oxide layer over a portion of the p-well region and a second region of silicon nitride on the first thin oxide layer over a second preselected portion of the surface;

f. forming a first photoresist layer over the wafer and patterning the first photoresist layer to form photoresist regions over the first and the second silicon nitride regions;

g. forming a second layer of photoresist over the wafer and patterning and etching the wafer to expose first and second portions of the thin oxide layer overlying the p-well region which first and second portions are adjacent the first silicon nitride region and the overlying first photoresist region;

h. implanting p-type impurities into the substrate beneath the first and second portions of the thin oxide layer;

i. removing remaining portions of the first and second photoresist layers;

j. implanting n-type impurities into the surface except beneath the first and second silicon nitride regions;

k. removing the first and second nitride regions and the thin oxide layer;

l. forming field oxide regions and adjacent the first and second preselected surface regions to selectively isolate the portions;

m. forming gate oxides over the first and second preselected surface regions;

n. forming a third layer of photoresist over the wafer and patterning the etching the third photoresist layer to expose the gate oxide overlying selected areas of the first surface regions;

o. implanting n-type impurity into the selected areas of first surface regions;

p. forming a first layer of p-type polysilicon over the wafer and patterning and etching the first polysilicon layer to form a first region of first polysilicon overlying the first preselected surface region, a second region of first polysilicon overlying the second preselected surface region, and third regions of first polysilicon overlying selected of the field oxide regions;

q. implanting n-type impurity into the p-well region adjacent the first region of first polysilicon to form n-type source and drain regions for the n-channel transistor;

r. implanting p-type impurity into the second preselected surface portion adjacent the second region of first polysilicon to form p-type source and drain regions for the p-channel transistor;

s. forming a first polyoxide layer over the first, second and third regions of first polysilicon and patterning the oxide to form contact holes to selected first polysilicon regions and selected n-type source and drain regions;

t. forming a second layer of polysilicon on the wafer to make contact with the selected of the first polysilicon regions and the selected n-type source and drain regions;

u. forming a second polyoxide layer over the second layer of polysilicon and patterning the second polysilicon and polyoxide layer;

v. forming a layer of phosphosilicate glass over the second polyoxide layer and patterning and etching the glass layer to form contact holes to selected second polysilicon regions, different first polysilicon regions, different n-type regions and the p-type regions;

w. forming metal contacts to said selected second polysilicon layer, different first polysilicon layer, different n-type regions, and the p-type regions, and x. forming a protective layer over the wafer.

* * * * *